United States Patent [19]

Denda

[11] Patent Number: 4,965,465
[45] Date of Patent: Oct. 23, 1990

[54] MONOSTABLE MULTIVIBRATOR CAPABLE OF GENERATING A PREDETERMINED WIDTH OF PULSE WITHOUT USING A DELAY CIRCUIT

[75] Inventor: Akira Denda, Tokyo, Japan

[73] Assignee: NEC Corporation, Tokyo, Japan

[21] Appl. No.: 390,998

[22] Filed: Aug. 7, 1989

[30] Foreign Application Priority Data

Aug. 6, 1988 [JP] Japan .................................. 63-196475

[51] Int. Cl.$^5$ ...................... H03K 3/284; H03K 3/017; H03K 5/08; H03K 3/01
[52] U.S. Cl. ..................................... 307/273; 307/265; 328/58; 328/207
[58] Field of Search ................ 307/273, 265, 268, 234, 307/363, 354; 328/34, 58, 60, 61

[56] References Cited

U.S. PATENT DOCUMENTS

| | | | |
|---|---|---|---|
| 4,245,167 | 1/1981 | Stein | 307/273 |
| 4,260,912 | 4/1981 | Bjorke | 307/273 |
| 4,425,514 | 1/1984 | Orr et al. | 307/273 |

Primary Examiner—Stanley D. Miller
Assistant Examiner—Trong Phan
Attorney, Agent, or Firm—Helfgott & Karas

[57] ABSTRACT

A monostable multivibrator comprising an input terminal receiving a trigger signal, a time constant circuit having at least a capacitor, a first pulse generator connected to the input terminal for generating a first pulse in synchronism with a leading edge of the trigger pulse, a first set-reset flipflop having a reset input connected to the first pulse generator and a Q output connected through a discharge circuit to one end of the capacitor, a first Schmitt circuit having an input connected to the one end of the capacitor and an output connected to a set input of the first flipflop, the first Schmitt circuit having a first threshold corresponding to a potential slightly higher than a potential of a logical low level so that the Schmitt circuit can detect a substantial discharge of the capacitor, a second Schmitt circuit having an input connected to the one end of the capacitor and having a second threshold corresponding to a potential slightly lower than a potential of a logical high level so that the Schmitt circuit can detect a substantial charge of the capacitor, a second pulse generator having an input connected to an output of the second Schmitt circuit for generating a second pulse in synchronism with a leading edge of the output of the second Schmitt, a second set-reset flipflop having a reset input connected to receive the second pulse from the second pulse generator and a $\overline{Q}$ output connected to an output terminal, and a logic gate having a first input connected to the output of the first pulse generator, a second input connected to the $\overline{Q}$ output of the second flipflop and an output connected to a set input of the second flipflop.

3 Claims, 2 Drawing Sheets

MONOSTABLE MULTIVIBRATOR CAPABLE OF GENERATING A PREDETERMINED WIDTH OF PULSE WITHOUT USING A DELAY CIRCUIT

BACKGROUND OF THE INVENTION

1. Field of the Invention

The present invention relates to a monostable multivibrator circuit, and more specifically to a re-triggerable monostable multivibrator including a time constant circuit having at least a capacitor and for generating a predetermined width of pulse.

2. Description of Related Art

Monostable multivibrators are widely used in digital integrated circuits. It is a general matter that the monostable multivibrator used in the digital integrated circuits have been composed of logic circuits mainly due to limitation of the kind and characteristics of elements which can be assembled in the integrated circuit.

Referring to FIG. 1, there is shown a typical conventional monostable multivibrator having a re-triggerable function. The shown circuit includes an input terminal IN receiving a trigger signal, and a set-reset flipflop 10 having an inverted reset input $\bar{R}$ connected to the input terminal IN and a $\bar{Q}$ output connected to an output terminal OUT. A Q output of the flipflop 10 is connected to one input 12A of a two-input NAND gate 12, which has an output connected to a discharge circuit 14 of the open collector type or the open drain type. An open collector or drain output of the discharge circuit 14 is connected to a connection node A or series connected resistor $R_{EXT}$ and a capacitor $C_{EXT}$, which cooperates to form a time constant circuit. The node A is connected to an inverted reset input $\bar{R}$ of the flipflop 10 through an inverter 16.

Furthermore, the input terminal IN is connected to an input of another inverter 18, whose output is connected directly to a first input 20A of a three-input NAND gate 20. The output of the inverter 18 is also connected through a delay circuit 22 and an inverter 24 to a second input 20B of the three-input NAND gate 20. A third input 20C of the NAND gate 20 is connected to the Q output of the flipflop 10. An output of the NAND gate 20 is connected to a second input 12B of the two-input NAND gate 12.

With the above mentioned arrangement, a negative-going trigger signal is inputted to input terminal IN, the $\bar{Q}$ of the flipflop 10 is brought from a high level to a low level, so that an output signal appearing on the output terminal OUT is brought to a low level. Namely, a negative-going one-shot pulse signal starts.

At the same time, the Q output of the flipflop 10 is brought from the low level to the high level. Since the second input 12B of the NAND gate 12 is at the high level in an initialized condition, both the inputs of the NAND gate 12 become the high level, and therefore, the output of the NAND gate 12 is brought from the high level to the low level. Thus, the open collector or drain of the discharge circuit 14 is put in a high impedance condition, so that the capacitor $C_{EXT}$ will be started to be charged through the resistor $R_{EXT}$.

When a time constant determined by the $C_{EXT}$ and the resistor $R_{EXT}$ has elapsed, a potential of the node A will exceed a threshold of the inverter 16, so that a low level signal is applied to the inverted reset input $\bar{R}$ of the flipflop 10. As a result, the $\bar{Q}$ output of the flipflop 10 is returned from the low level to the high level. Namely, the negative-going one-shot pulse signal terminates.

Simultaneously, the Q output of the flipflop 10 is returned from the high level to the low level, so that an electric charge stored in the capacitor $C_{EXT}$ will be discharged through the open collector or drain output path of the discharge circuit put in a conduction condition. As a result, the potential of the node A is returned to almost the ground potential, and the inverted reset input $\bar{R}$ of the flipflop 10 is brought to the high level, so that the monostable multivibrator is returned to the initialized condition.

If a trigger signal is inputted to the input terminal IN in the way of the charge of the capacitor $C_{EXT}$, the output pulse appearing on the output terminal OUT is elongated in the following manner:

When the capacitor $C_{EXT}$ is being charged, the three inputs of the NAND gate 20 assumes the following conditions:

First input 20A : low level
Second input 20B : high level
Third input 20C : high level In this condition, if a re-trigger signal is applied to the input terminal IN, the first input 20A of the NAND gate 20 is brought to the high level, and therefore, the output of the NAND gate 20 outputs the low level. As a result, without regard to the level of the Q output of the flipflop 10, the NAND gate 12 will assume the high level, and the open collector or drain output path of the discharge circuit 14 is brought to a conduction condition. Namely, the capacitor $C_{EXT}$ which has been in the charging way, is forcibly discharged, again.

After a delay time $\Delta t$ given the delay circuit 22 has elapsed, the second input 20B of the NAND gate 20 is brought to the low level, so that the output of the NAND gate 12 is brought to the low level. Accordingly, the open collector or drain output path of the discharge circuit 14 is brought to a high impedance condition. Namely, the capacitor $C_{EXT}$ is re-started to be charged.

When the re-trigger signal on the input terminal IN is returned to an original level (the high level), since the first input 20A of the three-input NAND gate 20 is brought to the low level at a time which is earlier than a moment that the second input 20B is returned to the high level, the output of the NAND gated 20 is fixed to the high level.

The above mentioned monostable multivibrator is disadvantageous in the following points:

The discharge time of the capacitor $C_{EXT}$, when a re-trigger signal is inputted, is determined by the delay circuit 22. The capacitance of the capacitor $C_{EXT}$ is large, a long discharge time is required. In such a case, therefore, it has been necessary to modify the delay time $\Delta t$ of the delay circuit 22.

In addition, if a trigger signal is applied in the way of a series initializing operation, the charge is started in some case before the capacitor $C_{EXT}$ has not yet been completely discharged. As a result, the width of the output pulse will adversely vary. In order to avoid this problem, the maximum capacitance of the capacitor $C_{EXT}$ has been limited. In other words, the conventional monostable multivibrator has been limited in the extent of application due to the maximum capacitance of the capacitor $C_{EXT}$.

SUMMARY OF THE INVENTION

Accordingly, it is an object of the present invention to provide a monostable multivibrator circuit which has overcome the above mentioned defect of the conventional one.

Another object of the present invention is to provide a re-triggerable monostable multivibrator having a time constant circuit including al least a capacitor and capable of generating a predetermined width of pulse in response to a re-trigger signal without using a delay circuit.

The above and other objects of the present invention are achieved in accordance with the present invention by a monostable multivibrator comprising an input terminal receiving a trigger signal, a time constant circuit having at least a capacitor, a first pulse generator connected to the input terminal for generating a first pulse in synchronism with a leading edge of the trigger pulse, a first set-reset flipflop having a reset input connected to the first pulse generator and a Q output connected through a discharge circuit to one end of the capacitor, a first Schmitt circuit having an input connected to the one end of the capacitor and an output connected to a set input of the first flipflop, the first Schmitt circuit having a first threshold corresponding to a potential slightly higher than a potential of a logical low level so that the Schmitt circuit can detect a substantial discharge of the capacitor, a second Schmitt circuit having an input connected to the one end of the capacitor and having a second threshold corresponding to a potential slightly lower than a potential of a logical high level so that the Schmitt circuit can detect a substantial charge of the capacitor, a second pulse generator having an input connected to an output of the second Schmitt circuit for generating a second pulse in synchronism with a leading edge of the output of the second Schmitt, a second set-reset flipflop having a reset input connected to receive the second pulse from the second pulse generator and a $\overline{Q}$ output connected to an output terminal, and a logic gate having a first input connected to the output of the second flipflop and an output connected to a set input of the second flipflop.

The above and other objects, features and advantages of the present invention will be apparent from the following description of preferred embodiments of the invention with reference to the accompanying drawings.

DESCRIPTION OF THE PREFERRED EMBODIMENTS

Figure 1:
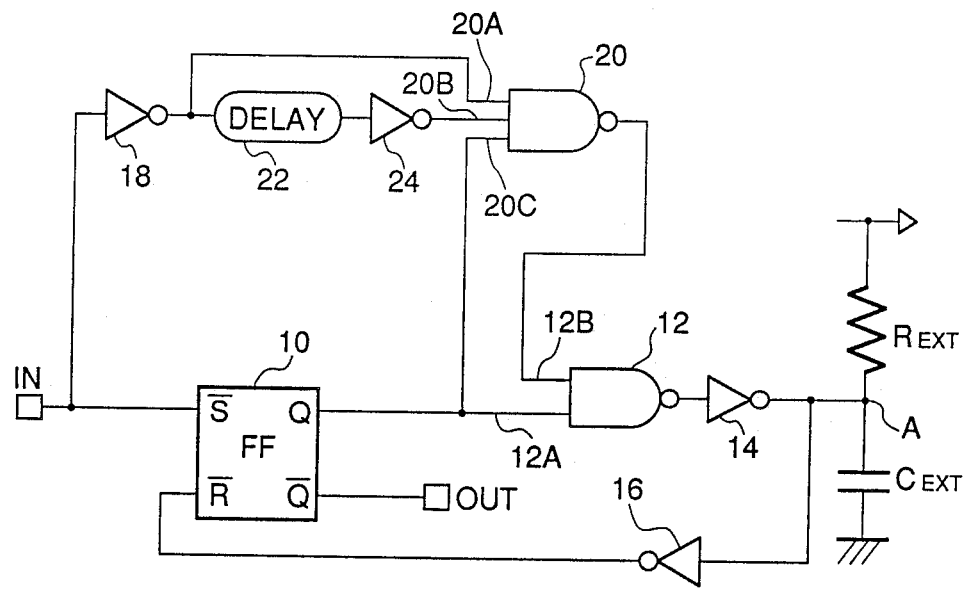
FIG. 1 is a logic diagram of one typical conventional monostable multivibrator.
Figure 2:
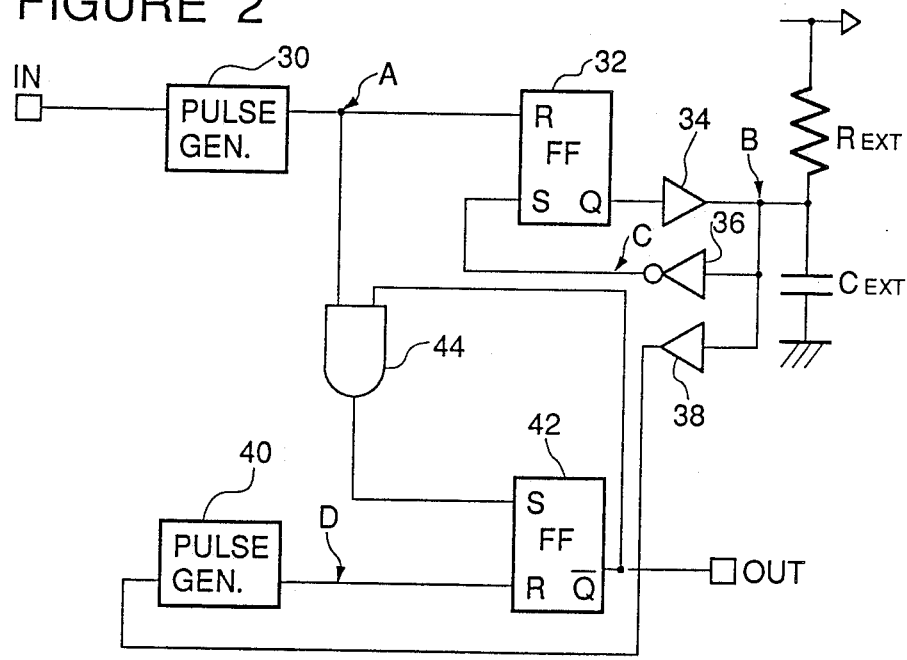
FIG. 2 is a logic diagram of an embodiment of the monostable multivibrator in accordance with the present invention.

Referring to FIG. 2, there is shown a logic diagram of an embodiment of the monostable multivibrator in accordance with the present invention.

The shown monostable multivibrator includes a first pulse generator 30 having an input connected to an input terminal IN and an output connected to a node A, which is connected to a reset input R of a first set-reset flipflop 32. The flipflop 32 has Q output connected to a discharge circuit 34, which is in turn connected to a connection node B of series connected resistor $R_{EXT}$ and capacitor $C_{EXT}$ which cooperate to form a time constant circuit. The node B is also connected to an input of a first Schmitt circuit 36 having a low threshold $V_{TH1}$ which is near to a potential of the logical low level but slightly higher than the potential of the logical low level. An output of the first Schmitt circuit 36 is connected to a set input S of the flipflop 32.

Furthermore, the node B is connected to an input of a second Schmitt circuit 38 having a high threshold $V_{TH2}$ which is slightly lower than a potential of the logical high level. Here, it should be noted that the threshold $V_{TH2}$ is sufficiently higher than the threshold $V_{TH1}$. An output of the second Schmitt circuit 38 is connected to an input of a second pulse generator 40, whose output is connected to a reset input R of a second set-reset flipflop 42. A $\overline{Q}$ output of the flipflop 42 is an also connected to output terminal OUT. The $\overline{Q}$ output of the flipflop 42 is also connected to a first input of an AND gate 44, which has a second input connected to the node A. An output of the AND gate 44 is connected to a set input S of the flipflop.

Figure 4:
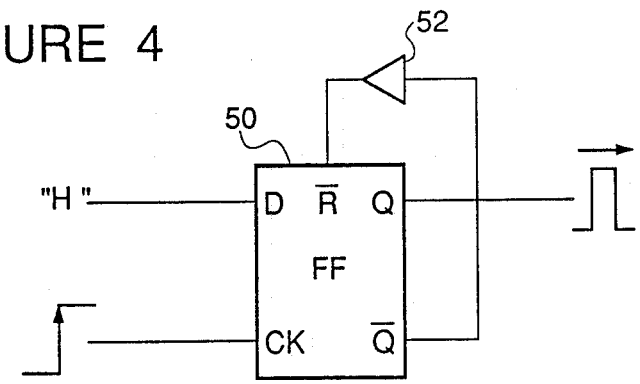
FIG. 4 illustrates one typical example of the pulse generator used in the monostable multivibrator shown in FIG. 2.

In the above mentioned monostable multivibrator, each of the first and second pulse generators 30 and 40 can be formed of a D-type flipflop 50 as shown in FIG. 4. Namely, a data input D of the flipflop 50 is connected to a high level "H" and a clock input CK is connected to the input of the pulse generator 30 or 40. Specifically, the clock input CK of the flipflop 50 is connected through an inverter to the input of the pulse generator. A Q output of the flipflop 50 is connected to an output of the pulse generator 30 or 40. A $\overline{Q}$ output of the flipflop 50 is connected to an inverted reset input $\overline{R}$ of the flipflop 50 through an noninverting gate 52. With this feedback path from $\overline{Q}$ output to the inverted reset input $\overline{R}$ of the flipflop 50, when a positive going edge is applied to the clock input CK, the Q output of the flipflop 50 is brought from a low level to a high level and immediately returned to the low level. Accordingly, a positive-going pulse is generated at the Q output of the flipflop 50.

Figure 3:
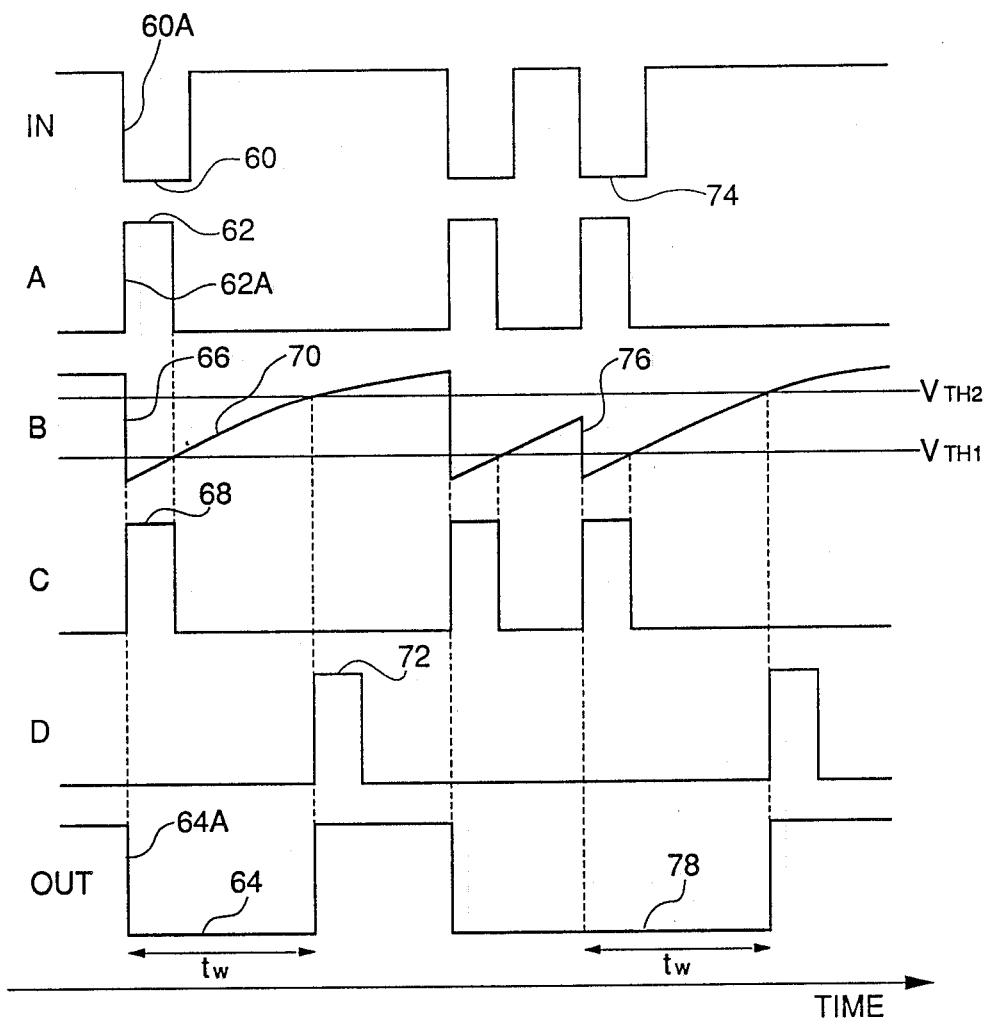
FIG. 3 is a timing chart illustrating an operation of the monostable multivibrator shown in FIG. 2.

Now, an operation of the above mentioned monostable multivibrator will be explained with reference to FIG. 3 illustrating an operation of the monostable multivibrator shown in FIG. 2. In FIG. 3, Reference Signs given at a left side indicate corresponding nodes or terminals shown in FIG. 2, respectively.

If a trigger signal 60 having a negative-going leading edge 60 is applied to the input terminal IN, the pulse generator 30 generates a pulse 62 having a positive-going leading edge 62 in synchronism with the negative-going leading edge 60 of the trigger signal. At this time, since the $\overline{Q}$ output of the flipflop 40 is at the high level in an initialized condition, the two-input AND gate 44 is in an open condition. Accordingly, the positive-going pulse 62 is applied to the reset input R of the flipflop 32 and the set input S of the flipflop 42.

As a result, the Q output of the flipflop 32 and the $\overline{Q}$ output of the flipflop 42 are brought to the low level, respectively. As a result of the low level of the $\overline{Q}$ output of the flipflop 42, the output terminal OUT is brought to the low level, and as shown in FIG. 3, a negative pulse 64 having a leading edge 64A in synchronism with the leading edge 62A of the trigger pulse 60 will start.

Furthermore, since the Q output of the flipflop 32 has been brought to the low level, the capacitor $C_{EXT}$ firstly discharge an electric charge stored therin, as shown by Reference Numeral 66. After the capacitor $C_{EXT}$ has been completely discharged, namely, when the potential of the node B has become lower than the threshold $V_{TH1}$ of the Schmitt circuit 36, the Schmitt circuit 36 generates at the output thereof a positive-going pulse 68, which is applied to the set input S of the flipflop 32 so as to bring the Q output of the flipflop 32 to the high level. As a result, the open collector or drain output path of the discharge circuit 34 is brought to the high impedance condition, so that the capacitor $C_{EXT}$ is started to be charged through the resistor $R_{EXT}$. Accordingly, the potential of the node B will gradually elevate as indicated by Reference Numeral 70 in FIG. 3. In this connection, as mentioned hereinbefore, since the threshold $V_{TH1}$ of the first Schmitt circuit 36 is near to a potential of the logical low level but slightly higher than the potential of the logical low level and sufficiently lower than the threshold $V_{TH2}$ of the second Schmitt circuit 38, the first Schmitt circuit 36 can monitor substantial completion of the discharge of the capacitor $C_{EXT}$.

If the potential of the node B becomes higher than the threshold $V_{TH1}$ of the first Schmitt circuit 36, the output of the first Schmitt circuit 36 is brought from the high level to the low level, so that the set input S of the flipflop 32 is brought to the low level. With this, the flipflop 32 becomes ready to receive the trigger signal, again.

After the time constant determined by the capacitor $C_{EXT}$ and the resistor $R_{EXT}$ has elapsed, the potential of the node B exceeds the threshold $V_{TH2}$ of the second Schmitt circuit 38, the second pulse generator 40 is triggered, and a positive pulse 72 is applied to the reset input R of the second flipflop 42. Accordingly, the $\overline{Q}$ output of the second flipflop 42 is brought from the low level to the high level, the negative pulse on the output OUT terminates as shown in FIG. 3. Incidentally, the flipflops 32 and 42 are designed so that when a signal is simultaneously applied to both the set input and the reset input, the signal inputted to the set input is in preference to the signal inputted to the reset input, in order to avoid the malfunction and influence due to spike noise.

Furthermore, as the result of the change of the $\overline{Q}$ output of the second flipflop 42 from the low level to the high level, the two-input AND gate 44 is closed. Therefore, an input of a signal to the set input S of the flipflop 42 is inhibited until a next signal is inputted to the reset input R of the flipflop 42. In this feature, a malfunction is effectively prevented.

As shown in a middle of FIG. 3, if a trigger signal 74 is inputted to the input terminal IN in the way of the charging of the capacitor $C_{EXT}$ (namely, if the monostable multivibrator is re-triggered), the Q output of the flipflop 32 is brought to the low level, and therefore, the capacitor $C_{EXT}$ is forcibly discharged as indicated by Reference Numeral 76 in FIG. 3. Similarly to the above mentioned discharge operation, this discharged is ensured, until the potential of the node B becomes lower than the threshold $V_{TH1}$ of the first Schmitt circuit 36.

After the capacitor $C_{EXT}$ has been completely discharged, the capacitor $C_{EXT}$ is re-started to be charged.

As a result, as shown in FIG. 3, an output pulse 78 having a period $T_W$ starting a leading edge of the re-trigger signal 74 is outputted to the terminal OUT.

In the above mentioned embodiment, a trigger signal applied through the input terminal IN and a signal for notifying completion of the charging of the capacitor are supplied through the pulse generator 30 or the pulse generator 40 to the second flipflop which determines the shape or width of the output pulse. Therefore, the monostable multivibrator in accordance with the present invention can generates a one-shot pulse even if any shape of a trigger signal is inputted. In addition, since the first Schmitt circuit monitors the discharge of the capacitor, it becomes unnecessary to consider the discharge time dependent upon the capacitance of the capacitor. Accordingly the monostable multivibrator in accordance with the present invention can stably operate without being influenced by the capacitance of the capacitor.

The invention has thus been shown and described with reference to the specific embodiments. However, it should be noted that the present invention is in no way limited to the details of the illustrated structures but changes and modifications may be made within the scope of the appended claims.

I claims:

1. A monostable multivibrator comprising an input terminal receiving a trigger signal, a time constant circuit having at least a capacitor, a first pulse generator connected to the input terminal for generating a first pulse in synchronism with a leading edge of the trigger pulse, a first set-reset flipflop having a reset input connected to the first pulse generator and a Q output connected through a discharge circuit to one end of the capacitor, a first Schmitt circuit having an input connected to the one end of the capacitor and an output connected to a set input of the first flipflop, the first Schmitt circuit having a first threshold corresponding to a potential slightly higher than a potential of a logical low level so that the Schmitt circuit can detect a substantial discharge of the capacitor, a second Schmitt circuit having an input connected to the one end of the capacitor and having a second threshold corresponding to a potential slightly lower than a potential of a logical high level so that the Schmitt circuit can detect a substantial charge of the capacitor, a second pulse generator having an input connected to an output of the second Schmitt circuit for generating a second pulse in synchronism with a leading edge of the output of the second Schmitt, a second set-reset flipflop having a reset input connected to receive the second pulse from the second pulse generator and a $\overline{Q}$ output connected to an output terminal, and a logic gate having a first input connected to the output of the first pulse generator, a second input connected to the $\overline{Q}$ output of the second flipflop and an output connected to a set input of the second flipflop.

2. A monostable multivibrator claimed in claim 1 wherein the logic gate is composed of an AND gate.

3. A monostable multivibrator claimed in claim 1 wherein the one end of the capacitor is connected through a resistor to a positive voltage and the other end of the capacitor is connected is grounded.

* * * * *